(12) United States Patent
Wu

(10) Patent No.: US 10,980,111 B2
(45) Date of Patent: Apr. 13, 2021

(54) CIRCUIT BOARD AND DISPLAY DEVICE

(71) Applicants: HKC Corporation Limited, Guangdong (CN); Chongqing HKC Optoelectronics Technology Co., Ltd., Chongqing (CN)

(72) Inventor: Qiong Wu, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/625,508

(22) PCT Filed: Aug. 10, 2017

(86) PCT No.: PCT/CN2017/096720
§ 371 (c)(1),
(2) Date: Dec. 20, 2019

(87) PCT Pub. No.: WO2019/000594
PCT Pub. Date: Jan. 3, 2019

(65) Prior Publication Data
US 2020/0344884 A1    Oct. 29, 2020

(30) Foreign Application Priority Data
Jun. 29, 2017   (CN) .......................... 201710514912.4

(51) Int. Cl.
*H05K 1/03*    (2006.01)
*H05K 1/18*    (2006.01)

(52) U.S. Cl.
CPC ............. *H05K 1/036* (2013.01); *H05K 1/188* (2013.01); *H05K 2201/017* (2013.01); *H05K 2201/0195* (2013.01)

(58) Field of Classification Search
CPC ...... H05K 1/036; H05K 1/0367; H05K 1/038; H05K 1/188; H05K 2201/017; H05K 2201/0195
See application file for complete search history.

(56) References Cited

U.S. PATENT DOCUMENTS

| 2013/0169692 A1* | 7/2013 | Wang | ................... | G09G 3/3406 |
| | | | | 345/690 |
| 2014/0004344 A1* | 1/2014 | Kim | ........................ | D01D 1/06 |
| | | | | 428/367 |

(Continued)

FOREIGN PATENT DOCUMENTS

| CN | 101354495 A | 1/2009 |
| CN | 101848604 A | 9/2010 |

(Continued)

*Primary Examiner* — Hoa C Nguyen
(74) *Attorney, Agent, or Firm* — Muncy, Geissler, Olds & Lowe, P.C.

(57) ABSTRACT

A circuit board and a display device are disclosed. The circuit board includes an insulating layer and a metal foil layer. The metal foil layer is disposed on a surface of the insulating layer. The insulating layer comprises the graphene. The insulating layer comprises a glass felt semicured layer and a glass cloth semicured layer. The glass felt semicured layer and the glass cloth semicured layer are stacked. The glass felt semicured layer includes a glass felt layer and a high thermal conductive adhesive layer covering a surface of the glass felt layer. The glass cloth semicured layer comprises a glass cloth layer and the high thermal conductive adhesive layer covering a surface of the glass cloth layer. The high thermal conductive adhesive layer comprises the graphene, and the glass felt semicured layer and the glass cloth semicured layer also comprise the graphene.

17 Claims, 4 Drawing Sheets

(56) References Cited

U.S. PATENT DOCUMENTS

2014/0312498 A1* 10/2014 Sugiyama ............... H01L 24/14
257/741
2016/0057854 A1* 2/2016 Schneider ............... B32B 27/36
174/252

FOREIGN PATENT DOCUMENTS

| CN | 105172262 A | 12/2015 |
| CN | 105838028 A | 8/2016 |
| CN | 106504691 A | 3/2017 |
| EP | 0333160 A2 | 9/1989 |
| WO | WO 2016089052 A1 | 11/2015 |
| WO | WO 2016049477 A1 | 3/2016 |

* cited by examiner

CIRCUIT BOARD AND DISPLAY DEVICE

BACKGROUND

Technical Field

This disclosure relates to a technical field of a display, and more particularly to a circuit board and a display device.

Related Art

The existing displays are generally controlled based on the active switch. The display has many advantages, such as the slim body, the power-saving property, the radiation less property and the like, and has been widely used. The displays mainly comprise the liquid crystal displays, OLED (Organic Light-Emitting Diode) displays, QLED (Quantum Dot Light-Emitting Diodes) displays, plasma displays, and the likes. In the outer structure, the display can be a flat display or a curved display.

For example, the liquid crystal display comprises a display panel and a backlight module. The working principle of the display panel is to dispose the liquid crystal molecules between two parallel glass substrates, and to apply driving voltages to the two glass substrates for controlling the rotating directions of the liquid crystal molecules, which can refract the light rays from the backlight module to produce a frame.

An organic light emitting diode (OLED) display adopts self-lighting of organic light emitter diodes to display, and has the advantages including self-lighting, a wide viewing angle, an almost infinite high contrast ratio, the lower power consumption, the extremely high response speed and the like.

A structure of the QLED display is very similar to that of the OLED technology except for the main difference that the light emitting center of the QLED is constituted by a substance of quantum dots. The structure is such that both electrons and holes converge in the quantum dot layer to form excitons, and emit light through the recombination of excitons.

A circuit board is a basic material in the electronic industry. A portion of energy of components disposed on the circuit board in a working state is released in the form of heat. The existing circuit board has the poor heat dissipating effect, which tends to affect the normal work of the circuit board.

SUMMARY

An objective of this disclosure is to provide a circuit board with the effectively enhanced heat dissipating performance.

To solve the above problem, an embodiment of the disclosure provides a circuit board comprising:

A circuit board comprises:
an insulating layer; and
a metal foil layer covering the insulating layer.

The metal foil layer is disposed on a surface of the insulating layer, the insulating layer includes at least one layer, and the insulating layer comprises the graphene.

The insulating layer comprises a glass felt semi-cured layer and a glass cloth semi-cured layer. The glass felt semi-cured layer and the glass cloth semi-cured layer are stacked with each other. Stacking a glass felt semi-cured layer and a glass cloth semi-cured layer with each other to form the insulating layer can make the insulating layer enhance the insulation performance of the insulating layer in the circuit board, and effectively prevent the circuit board made of the circuit board from presenting the turn-on problem, and thus to better guarantee the good working performance of the circuit board. In addition, the provision of the graphene can effectively reduce the heat transfer resistance on the interface, so that the connection between the stacked glass felt semi-cured layer and the glass cloth semi-cured layer becomes closer, the heat transfer in the insulating layer becomes more directly effective, and the thermal conductivity of the circuit board is further enhanced. Meanwhile, the glass felt semi-cured layer and the glass cloth semi-cured layer arranged in two layers can effectively enhance the rigidity of the circuit board, so that the circuit board becomes harder and cannot be easily broken.

In one embodiment, the metal foil layer is disposed on the glass felt semi-cured layer, and the glass felt semi-cured layer is disposed between the glass cloth semi-cured layer and the metal foil layer. Disposing the glass cloth semi-cured layer as the first layer can effectively enhance the rigidity of the circuit board, and provide the effective support for the glass felt semi-cured layer. The glass felt semi-cured layer is relatively more brittle. Two surfaces of the glass cloth semi-cured layer and the metal foil layer are in flat surface contact the glass felt semi-cured layer to effectively protect the glass felt semi-cured layer and to further enhance the durability of the circuit board. In addition, the provision of the graphene can enhance the interface compatibility of the contact surface between the glass felt semi-cured layer and the glass cloth semi-cured layer, so that the connection between the glass felt semi-cured layer and the glass cloth semi-cured layer becomes closer, so that the heat transferred to the glass felt semi-cured layer can be better transferred to the glass cloth semi-cured layer, and the thermal conductivity of the circuit board is further enhanced.

In one embodiment, the glass felt semi-cured layer comprises a glass felt layer and a high thermal conductive adhesive layer, and the high thermal conductive adhesive layer covers a surface of the glass felt layer. Forming the glass felt semi-cured layer by the glass felt layer and the high thermal conductive adhesive layer can effectively enhance the thermal conductivity of the insulating layer in the circuit board. The high thermal conductive adhesive layer is further beneficial to the heat diffusion, and can better enhance the heat dissipation efficiency of the circuit board. The glass felt layer has the uniform thickness and the moderate hardness. The high thermal conductive adhesive layer covers the surface of the glass felt layer. The glass felt layer effectively shaping and fixing the high thermal conductive adhesive layer can effectively enhance the stability of the high thermal conductive adhesive layer. In addition, because the glass felt layer has the high penetration rate, the high thermal conductive adhesive layer can be conveniently coated over the surface of the glass felt layer. Meanwhile, the glass felt layer has the good mold filling property and mold covering property, and is applicable to the production of the circuit board.

In one embodiment, the glass cloth semi-cured layer comprises a glass cloth layer and the high thermal conductive adhesive layer covering the surface of the glass cloth layer. Forming the glass cloth semi-cured layer by the glass cloth layer and the high thermal conductive adhesive layer can effectively enhance the thermal conductivity of the insulating layer in the circuit board. The high thermal conductive adhesive layer is further beneficial to the heat diffusion, and can better enhance the heat dissipation efficiency of the circuit board.

In one embodiment, the high thermal conductive adhesive layer comprises the graphene. Disposing the graphene in the high thermal conductive adhesive layer can effectively enhance the thermal conductivity of the insulating layer in the circuit board. When the circuit board is used as a substrate for the manufacturing of the circuit board, it is beneficial to the heat dissipating of the components disposed on the circuit board, to the further enhancement of the performance of the circuit board, and thus to the guarantee of the longer lifetime of the circuit board. In addition, the provision of the graphene can reduce the heat transfer resistance on the interface of the connection portion between the high thermal conductive adhesive layer and the glass cloth or glass felt, so that the high thermal conductive adhesive layer can be better fused to the glass cloth or glass felt to form the insulating layer.

In one embodiment, the glass felt semi-cured layer and the glass cloth semi-cured layer comprise the graphene. The configuration of the graphene can enhance the interface compatibility of the contact surface between the glass felt semi-cured layer and the glass cloth semi-cured layer, so that the connection between the glass felt semi-cured layer and the glass cloth semi-cured layer becomes closer. Thus, the thermal conductivity of the circuit board is further enhanced.

In one embodiment, the glass felt semi-cured layer and the glass cloth semi-cured layer comprise the graphene. Disposing the graphene in the glass felt semi-cured layer and the glass cloth semi-cured layer can enhance the interface compatibility of the contact surface between the glass felt semi-cured layer and the glass cloth semi-cured layer, so that the connection between the glass felt semi-cured layer and the glass cloth semi-cured layer becomes closer. Thus, the heat transferred to the glass felt semi-cured layer can be better transferred to the glass cloth semi-cured layer, and the thermal conductivity of the circuit board is further enhanced.

In one embodiment, the graphene is acidified graphene. Acidifying the graphene can effectively enhance the surface activity of the graphene, and thus enhance the interface compatibility between the graphene and the matrix resin and reduce the heat transfer resistance on the interface.

Another objective of this disclosure is to provide a display device with the effectively enhanced heat dissipating performance.

A display device comprises a control component, a display panel, and a backlight module. The backlight module comprises the above-mentioned circuit board.

In this disclosure, the graphene is disposed in the insulating layer to effectively enhance the thermal conductivity of the insulating layer in the circuit board. When the circuit board functions as the substrate for the manufacturing of the circuit board, it is beneficial to the heat dissipating of the components disposed on the circuit board, to the further enhancement of the performance of the circuit board, and thus to the guarantee of the longer lifetime of the circuit board. In addition, the metal foil layer is disposed on the surface of the insulating layer, so that the metal foil layer may directly contact the insulating layer. This is further beneficial to the heat diffusion, and the heat dissipation efficiency of the circuit board can be enhanced. The metal foil layer may cover one or two surfaces of the insulating layer, and can be selectively provided according to the actual production requirement. Of course, the insulating layer may be repeatedly stacked into multiple layers to better enhance the thermal conductivity of the circuit board and further to effectively enhance the rigidity of the circuit board, so that the circuit board becomes more sturdy, and cannot be easily folded to cause damages in the actual production and application.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

Figure 1:
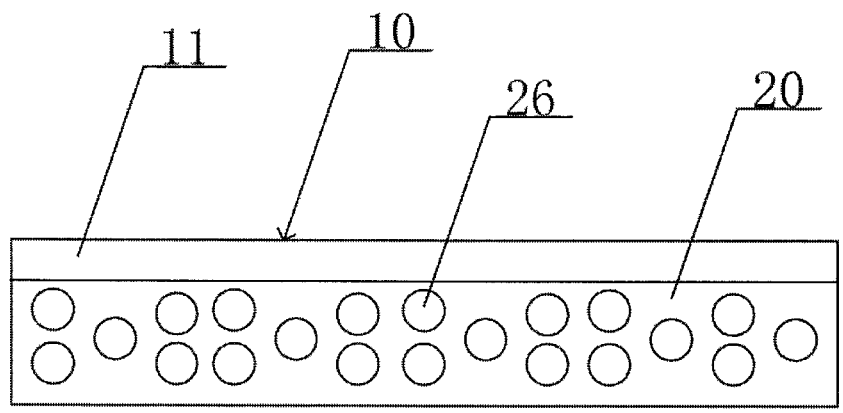
FIG. 1 is a schematic view showing a structure of a circuit board according to an embodiment of this disclosure.
Figure 2:
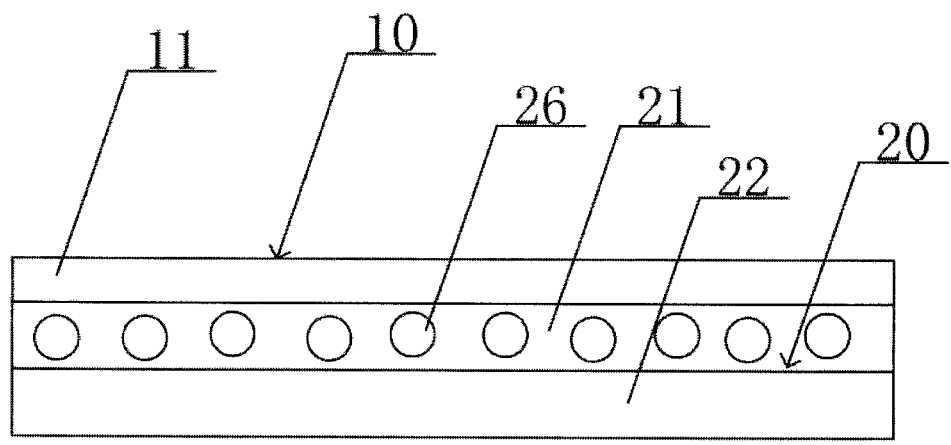
FIG. 2 is a schematic view showing a structure of a circuit board according to an embodiment of this disclosure.
Figure 3:
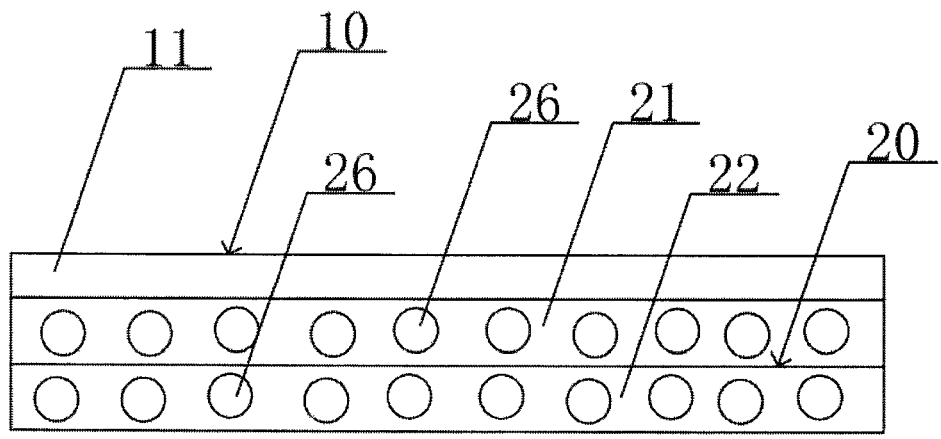
FIG. 3 is a schematic view showing a structure of a circuit board according to an embodiment of this disclosure.
Figure 4:
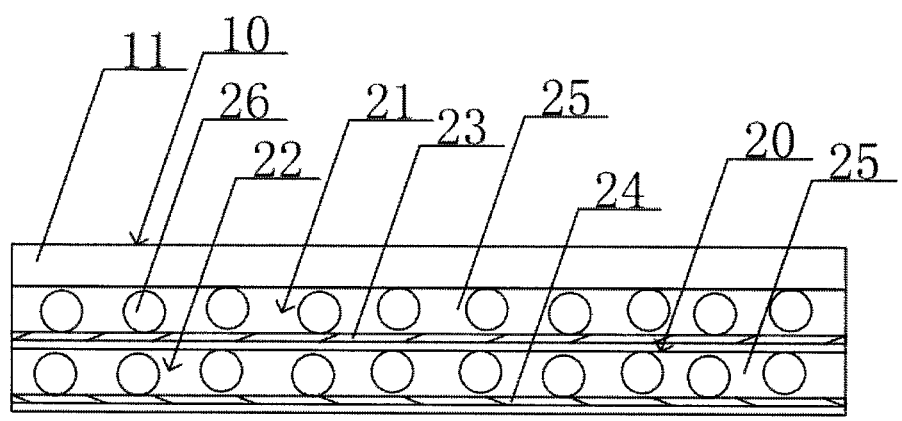
FIG. 4 is a schematic view showing a structure of a circuit board according to an embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

In the drawings, the same references relate to the same elements.

The circuit board and the display device of this disclosure will be described in detail with reference to FIGS. 1 to 7.

As shown in FIGS. 1 to 5, a circuit board comprises:

an insulating layer; and a metal foil layer covering the insulating layer. The metal foil layer is disposed on a surface of the insulating layer, the insulating layer includes at least one layer, and the insulating layer comprises the graphene.

The insulating layer 20 comprises the graphene 26. The graphene 26 has the coefficient of heat conductivity capable of reaching 5300 W/mK to effectively enhance the thermal conductivity of the insulating layer 20 in a circuit board 10. When the circuit board 10 functions as the substrate for the manufacturing of the circuit board, it is beneficial to the heat dissipating of the components disposed on the circuit board, to the further enhancement of the performance of the circuit board, and thus to the guarantee of the longer lifetime of the circuit board. In addition, a metal foil layer 11 is disposed on the surface of the insulating layer 20, so that the metal foil layer 11 may directly contact the insulating layer 20. This is further beneficial to the heat diffusion, and the heat dissipation efficiency of the circuit board 10 can be enhanced. The metal foil layer 11 may cover one or two surfaces of the insulating layer 20, and can be selectively provided according to the actual production requirement. Of course, the insulating layer 20 may be repeatedly stacked into multiple layers to better enhance the thermal conductivity of the circuit board 10 and further to effectively enhance the rigidity of the circuit board 10, so that the circuit board 10 becomes more sturdy, and cannot be easily folded to cause damages in the actual production and application. The material of the metal foil layer 11 may be selected from the group consisting of copper, aluminum, silver, gold, tin, silver and an alloy of the above-mentioned metal materials.

In this embodiment, the insulating layer 20 comprises a glass felt semi-cured layer 21 and a glass cloth semi-cured layer 22, and the glass felt semi-cured layer 21 and the glass cloth semi-cured layer 22 are stacked with each other. Stacking a glass felt semi-cured layer 21 and a glass cloth semi-cured layer 22 with each other to form the insulating layer 20 can make the insulating layer 20 enhance the insulation performance of the insulating layer 20 in the circuit board 10, and effectively prevent the circuit board made of the circuit board 10 from presenting the turn-on problem, and thus to better guarantee the good working performance of the circuit board. In addition, the provision of the graphene 26 can effectively reduce the heat transfer resistance on the interface, so that the connection between the stacked glass felt semi-cured layer 21 and the glass cloth semi-cured layer 22 becomes closer, the heat transfer in the insulating layer 20 becomes more directly effective, and the thermal conductivity of the circuit board 10 is further enhanced. Meanwhile, the glass felt semi-cured layer 21 and the glass cloth semi-cured layer 22 arranged in two layers can effectively enhance the rigidity of the circuit board 10, so that the circuit board 10 becomes harder and cannot be easily broken.

In this embodiment, the metal foil layer 11 is disposed on the glass felt semi-cured layer 21, and the glass felt semi-cured layer 21 is disposed between the glass cloth semi-cured layer 22 and the metal foil layer 11. Disposing the glass cloth semi-cured layer 22 as the first layer can effectively enhance the rigidity of the circuit board 10, and provide the effective support for the glass felt semi-cured layer 21. The glass felt semi-cured layer 21 is relatively more brittle. Two surfaces of the glass cloth semi-cured layer 22 and the metal foil layer 11 are in flat surface contact the glass felt semi-cured layer 21 to effectively protect the glass felt semi-cured layer 21 and to further enhance the durability of the circuit board 10. In addition, the provision of the graphene 26 can enhance the interface compatibility of the contact surface between the glass felt semi-cured layer 21 and the glass cloth semi-cured layer 22, so that the connection between the glass felt semi-cured layer 21 and the glass cloth semi-cured layer 22 becomes closer, so that the heat transferred to the glass felt semi-cured layer 21 can be better transferred to the glass cloth semi-cured layer 22, and the thermal conductivity of the circuit board 10 is further enhanced.

The glass felt semi-cured layer 21 comprises a glass felt layer 23 and a high thermal conductive adhesive layer 25 covering the surface of the glass felt layer 23. Forming the glass felt semi-cured layer 21 by the glass felt layer 23 and the high thermal conductive adhesive layer 25 can effectively enhance the thermal conductivity of the insulating layer 20 in the circuit board 10. The high thermal conductive adhesive layer 25 is further beneficial to the heat diffusion, and can better enhance the heat dissipation efficiency of the circuit board 10. The glass felt layer 23 has the uniform thickness and the moderate hardness. The high thermal conductive adhesive layer 25 covers the surface of the glass felt layer 23. The glass felt layer 23 effectively shaping and fixing the high thermal conductive adhesive layer 25 can effectively enhance the stability of the high thermal conductive adhesive layer 25. In addition, because the glass felt layer 23 has the high penetration rate, the high thermal conductive adhesive layer 25 can be conveniently coated over the surface of the glass felt layer 23. Meanwhile, the glass felt layer 23 has the good mold filling property and mold covering property, and is applicable to the production of the circuit board 10.

The glass cloth semi-cured layer 22 comprises a glass cloth layer 24 and the high thermal conductive adhesive layer 25 covering the surface of the glass cloth layer 24. Forming the glass cloth semi-cured layer 22 by the glass cloth layer 24 and the high thermal conductive adhesive layer 25 can effectively enhance the thermal conductivity of the insulating layer 20 in the circuit board 10. The high thermal conductive adhesive layer 25 is further beneficial to the heat diffusion, and can better enhance the heat dissipation efficiency of the circuit board 10. The glass cloth layer 24 has the better insulation and thermal isolation performances. Using the high thermal conductive adhesive layer 25 to cover the surface of the glass cloth layer 24 can effectively enhance the thermal conductivity of the insulating layer 20. In addition, because the glass cloth layer 24 has the high-temperature withstanding property and the high structural strength, the glass cloth layer 24 can effectively shape and fix the high thermal conductive adhesive layer 25.

The high thermal conductive adhesive layer 25 comprises the graphene 26. Disposing the graphene 26 in the high thermal conductive adhesive layer 25 can effectively enhance the thermal conductivity of the insulating layer 20 in the circuit board 10. When the circuit board 10 is used as a substrate for the manufacturing of the circuit board, it is beneficial to the heat dissipating of the components disposed on the circuit board, to the further enhancement of the performance of the circuit board, and thus to the guarantee of the longer lifetime of the circuit board. In addition, the provision of the graphene 26 can reduce the heat transfer resistance on the interface of the connection portion between the high thermal conductive adhesive layer 25 and the glass cloth or glass felt, so that the high thermal conductive adhesive layer 25 can be better fused to the glass cloth or glass felt to form the insulating layer 20.

The method of preparing the high thermal conductive adhesive solution comprises the steps of: mixing a curing agent and a curing accelerator with a solvent to obtain a mixed solvent; mixing a matrix resin with the mixed solvent to obtain a resin solution; and adding acidified graphene to the resin solution to obtain the high thermal conductive adhesive solution.

The solvent is acetone, the curing agent is an amine curing agent, the curing accelerator is a tertiary amine curing accelerator, and the matrix resin is an epoxy resin.

The method of adding the acidified graphene to the resin solution to obtain the high thermal conductive adhesive solution comprises: performing a surface acidification treatment on the graphene; mixing the acidified graphene with the resin solution to obtain a primary glue liquid; and performing high-speed shearing and maturating treatment on the primary glue liquid to obtain the high thermal conductive adhesive solution.

The glass felt semi-cured layer 21 or the glass cloth semi-cured layer 22 comprises the graphene 26. The provision of the graphene 26 can enhance the interface compatibility of the contact surface between the glass felt semi-cured layer 21 and the glass cloth semi-cured layer 22, so that the connection between the glass felt semi-cured layer 21 and the glass cloth semi-cured layer 22 becomes close, and the thermal conductivity of the circuit board 10 is further enhanced. It is possible to select to add the graphene 26 into the glass felt semi-cured layer 21 or the glass cloth semi-cured layer 22 according to the use requirement. Exemplarily, adding the graphene 26 into the glass felt semi-cured layer 21 can make the glass felt semi-cured layer 21 have the better thermal conductivity. The glass cloth semi-cured layer 22 can effectively isolate the heat, and thus better protect important components neighboring or contacting with the glass cloth semi-cured layer 22 to effectively prevent the important components from being over-heated and damaged.

The glass felt semi-cured layer 21 and the glass cloth semi-cured layer 22 comprise the graphene 26. Disposing the graphene 26 in the glass felt semi-cured layer 21 and the glass cloth semi-cured layer 22 can enhance the interface compatibility of the contact surface between the glass felt semi-cured layer 21 and the glass cloth semi-cured layer 22, so that the connection between the glass felt semi-cured layer 21 and the glass cloth semi-cured layer 22 becomes closer. Thus, the heat transferred to the glass felt semi-cured layer 21 can be better transferred to the glass cloth semi-cured layer 22, and the thermal conductivity of the circuit board 10 is further enhanced.

In this embodiment, the graphene 26 is acidified graphene. Acidifying the graphene 26 can effectively enhance the surface activity of the graphene 26, and thus enhance the interface compatibility between the graphene 26 and the matrix resin and reduce the heat transfer resistance on the interface.

The method of performing the surface acidification treatment on the graphene comprises: adding the graphene to a concentrated nitric acid at a predetermined temperature to react; filtering the reacted graphene after a predetermined time; and using distilled water to wash until the filtered liquid reaches a predetermined pH value to obtain acidified graphene.

The predetermined temperature ranges from 60 to 100° C., the optimum predetermined temperature is 80° C., the predetermined time ranges from 1.5 to 2.5 hours, the optimum predetermined time is 2 hours, the predetermined pH value ranges from 6.5 to 7.5, and the optimum predetermined pH value is 7.

Figure 5:
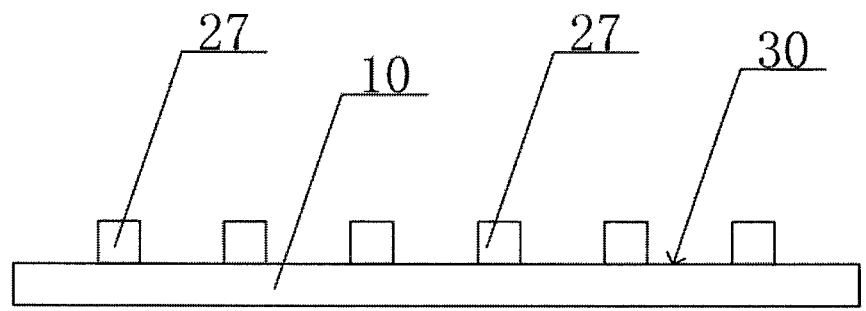
FIG. 5 is a schematic view showing a structure of a circuit board according to an embodiment of this disclosure.

As shown in FIG. 5, LED lamps 27 are disposed on the circuit board 10. When the LED lamp 27 emits light, a portion of energy is released in the form of thermal energy. The thermal energy is dissipated through the substrate manufactured from the circuit board 10 to effectively prevent the LED lamp 27 from being over-heated to affect the light emitting efficiency and lifetime of the LED lamp 27, and thus to better protect the LED lamp 27. With the continuous development of the display technology, the required number of LED lamps 27 is decreased, and the power of the lamp is increased in the backlight module of the display panel (especially the side entry type backlight module). Thus, the heat dissipating requirement on the LED lamp 27 is higher. A circuit board 30 manufactured using the circuit board 10 has the good thermal conductivity, and can completely satisfy the heat dissipating requirement of the high-power LED lamp 27.

Of course, it is possible to transfer the heat, generated by the LED lamp 27, to the heat-dissipating device of the backlight module, the back plate and the air through the circuit board 10 for fixing the LED. Thus, the heat dissipating requirement of the LED lamp 27 is satisfied. When the circuit board 10 of this disclosure is used together, the heat dissipating requirement of the LED lamp 27 can be better satisfied.

Figure 6:
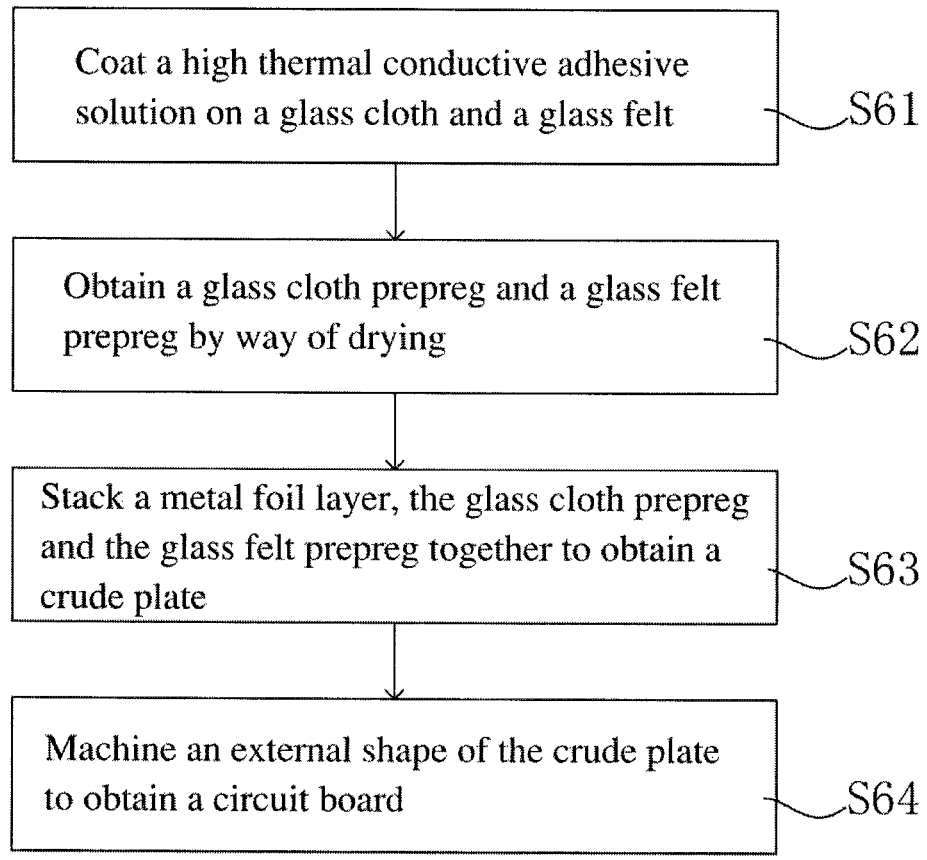
FIG. 6 is a flow chart showing a manufacturing method of a circuit board according to an embodiment of this disclosure.

Referring to FIG. 6, this embodiment discloses a method of manufacturing a circuit board. The method comprises the following steps.

In step S61, a high thermal conductive adhesive solution is coated on a glass cloth and a glass felt.

In step S62, a glass cloth prepreg and a glass felt prepreg are obtained by way of drying.

In step S63, a metal foil layer, the glass cloth prepreg and the glass felt prepreg are stacked together to obtain a crude plate.

In step S64, an external shape of the crude plate is machined to obtain a circuit board.

The method of stacking the metal foil layer, the glass cloth prepreg and the glass felt prepreg together to obtain the crude plate comprises: disposing the glass cloth prepreg on a bottom layer; stacking the glass felt prepreg on the glass cloth prepreg; stacking the metal foil layer on the glass felt prepreg; and obtaining the crude plate by way of hot pressing.

In the above embodiments, the display panel can be a liquid crystal panel, an OLED panel, a QLED panel, a plasma panel, a flat panel, a curved panel, and the likes.

Figure 7:
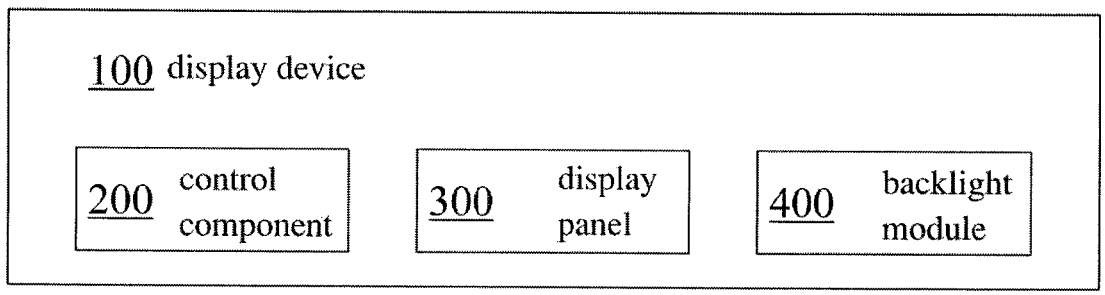
FIG. 7 is a schematic view showing a display device according to the embodiment of this disclosure.

Referring to FIG. 7, this embodiment discloses a display device 100. The display device 100 comprises a control component 200 and a display panel 300 of this disclosure, wherein the display panel will be described as an example in detail. It is to be described that the above-mentioned description of the structure of the display panel is also applicable to the display device according to the embodiment of this disclosure. When the display device according to the embodiment of this disclosure is a liquid crystal display, the liquid crystal display comprises a backlight module 400, the backlight module 400 comprises the circuit board 30, LED lamps 27 of light sources are disposed on the circuit board 30, and the backlight module 400 may serve as the light source for supplying the light with the sufficient luminance and the uniform distribution. The backlight module 400 of this embodiment may be of a front lighting type or a back lighting type. It is to be described that the backlight module 400 of this embodiment is not restricted thereto.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A circuit board, comprising:
   an insulating layer; and
   a metal foil layer covering the insulating layer;
   wherein the metal foil layer is disposed on a surface of the insulating layer, the insulating layer includes at least one layer, and the insulating layer comprises graphene; the insulating layer comprises a glass felt semi-cured layer and a glass cloth semi-cured layer, and the glass felt semi-cured layer and the glass cloth semi-cured layer are stacked with each other; the glass felt semi-cured layer comprises a glass felt layer and a high thermal conductive adhesive layer, and the high thermal conductive adhesive layer covers a surface of the glass felt layer; the glass cloth semi-cured layer comprises a glass cloth layer and the high thermal conductive adhesive layer, and the high thermal conductive adhesive layer covers a surface of the glass cloth layer; the high thermal conductive adhesive layer comprises the graphene; and the glass felt semi-cured layer and the glass cloth semi-cured layer comprise the graphene.

2. A circuit board, comprising:
   an insulating layer; and
   a metal foil layer covering the insulating layer;
   wherein the metal foil layer is disposed on a surface of the insulating layer, the insulating layer includes at least one layer, and the insulating layer comprises graphene, wherein the insulating layer comprises a glass felt semi-cured layer and a glass cloth semi-cured layer, and the glass felt semi-cured layer and the glass cloth semi-cured layer are stacked with each other.

3. The circuit board according to claim 2, wherein the metal foil layer is disposed on the glass felt semi-cured layer, and the glass felt semi-cured layer is disposed between the glass cloth semi-cured layer and the metal foil layer.

4. The circuit board according to claim 2, wherein the glass felt semi-cured layer comprises a glass felt layer and a high thermal conductive adhesive layer, and the high thermal conductive adhesive layer covers a surface of the glass felt layer.

5. The circuit board according to claim 3, wherein the glass cloth semi-cured layer comprises a glass cloth layer and a high thermal conductive adhesive layer, and the high thermal conductive adhesive layer covers a surface of the glass cloth layer.

6. The circuit board according to claim 4, wherein the high thermal conductive adhesive layer comprises the graphene.

7. The circuit board according to claim 2, wherein the glass felt semi-cured layer and the glass cloth semi-cured layer comprise the graphene.

8. The circuit board according to claim 2, wherein the glass felt semi-cured layer or the glass cloth semi-cured layer comprises the graphene.

9. The circuit board according to claim 2, wherein the graphene is acidified graphene.

10. A display device, comprising:
    a control component;
    a display panel; and
    a backlight module comprising a circuit board, wherein the circuit board comprises an insulating layer and a metal foil layer, the metal foil layer is disposed on a surface of the insulating layer, the insulating layer includes at least one layer, and the insulating layer comprises graphene,
    wherein the insulating layer comprises a glass felt semi-cured layer and a glass cloth semi-cured layer, and the glass felt semi-cured layer and the glass cloth semi-cured layer are stacked with each other.

11. The display device according to claim 10, wherein the metal foil layer is disposed on the glass felt semi-cured layer, and the glass felt semi-cured layer is disposed between the glass cloth semi-cured layer and the metal foil layer.

12. The display device according to claim 10, wherein the glass felt semi-cured layer comprises a glass felt layer and a high thermal conductive adhesive layer, and the high thermal conductive adhesive layer covers a surface of the glass felt layer.

13. The display device according to claim 10, wherein the glass cloth semi-cured layer comprises a glass cloth layer and a high thermal conductive adhesive layer, and the high thermal conductive adhesive layer covers a surface of the glass cloth layer.

14. The display device according to claim 12, wherein the high thermal conductive adhesive layer comprises the graphene.

15. The display device according to claim 10, wherein the glass felt semi-cured layer and the glass cloth semi-cured layer comprise the graphene.

16. The display device according to claim 10, wherein the glass felt semi-cured layer or the glass cloth semi-cured layer comprises the graphene.

17. The display device according to claim 10, wherein the graphene is acidified graphene.

* * * * *